United States Patent
He et al.

(10) Patent No.: US 9,836,562 B2
(45) Date of Patent: Dec. 5, 2017

(54) ITERATIVELY SIMULATING ELECTROSTATIC DISCHARGES FOR A REDUCED NETLIST

(71) Applicant: Oracle International Corporation, Redwood Shores, CA (US)

(72) Inventors: Qing He, San Jose, CA (US); Wai Chung William Au, San Jose, CA (US); Alexander Korobkov, San Jose, CA (US)

(73) Assignee: Oracle International Corporation, Redwood Shores, CA (US)

( * ) Notice: Subject to any disclaimer, the term of this patent is extended or adjusted under 35 U.S.C. 154(b) by 13 days.

(21) Appl. No.: 14/814,757

(22) Filed: Jul. 31, 2015

(65) Prior Publication Data
US 2017/0032062 A1   Feb. 2, 2017

(51) Int. Cl.
*G06F 17/50* (2006.01)

(52) U.S. Cl.
CPC ...... *G06F 17/5009* (2013.01); *G06F 17/5036* (2013.01); *G06F 17/5068* (2013.01); *G06F 17/5081* (2013.01)

(58) Field of Classification Search
CPC ............ G06F 17/5081; G06F 17/5009; G06F 11/261; G06F 17/5022; G06F 17/5045; G06F 1/18
USPC ................ 716/106, 109, 115, 122, 133, 136
See application file for complete search history.

(56) References Cited

U.S. PATENT DOCUMENTS

| | | | |
|---|---|---|---|
| 2007/0076338 A1* | 4/2007 | Traynor | H01L 27/0285 361/56 |
| 2008/0141198 A1* | 6/2008 | Chen | G06F 17/5036 716/102 |
| 2008/0148199 A1* | 6/2008 | Bell | G06F 17/5036 716/112 |
| 2016/0063172 A1* | 3/2016 | Lee | G06F 17/5081 716/109 |

OTHER PUBLICATIONS

Franell, E. et al., "ESD Full Chip Simulation: HBM and CDM Requirements and Simulation Approach", Advances in Radio Science, vol. 6, pp. 245-251, 2008 (7 pages).
Rommes, J. et al., "Efficient Methods for Large Resistor Networks, Computer-Aided Design of Integrated Circuits and Systems", IEEE Transactions on, vol. 29, No. 1, pp. 28-39, 2010 (12 pages).

(Continued)

*Primary Examiner* — Nghia Doan
(74) *Attorney, Agent, or Firm* — Osha Liang LLP

(57) ABSTRACT

A method for modeling electrostatic discharges. The method may include obtaining a circuit netlist for an integrated circuit. The circuit netlist may describe connection information for various electronic components within the integrated circuit. The method may further include obtaining, by removing a portion of the electronic components from the circuit netlist, a reduced netlist. The method may further include determining, using the reduced netlist, various circuit parameters regarding an electrostatic discharge event for the integrated circuit. The method may further include simulating, using the circuit parameters, a discharge path within the integrated circuit for the electrostatic discharge event.

17 Claims, 6 Drawing Sheets

(56) References Cited

OTHER PUBLICATIONS

Liou, J. J. et al., "Compact MOSFET Model for ESD Applications", Workshop on Compact Modeling, Mar. 2004 (35 pages).
Anzai, H. et al., "Equivalent Circuit Model of ESD Protection Devices", Fujitsu Sci. Tech. J., vol. 39 pp. 119-127, 2003 (10 pages).
Qian, H. et al., "A Chip-level Electrostatic Discharge Simulation Strategy", Computer-Aided Design, 2004. ICCAD-2004, IEEE/ACM International Conference on, pp. 315-318 (4 pages).
Wu, M., et al., "An Efficient Full-Chip ESD Paths Resistance Value Verification Flow for Large Scale Designs", Electrical Overstress/Electrostatic Discharge Symposium (EOS/ESD), pp. 1-4, 2013 (4 pages).
White Paper 3 System Level ESD Part II: Implementation of Effective ESD Robust Designs, The Electrostatic Discharge Association, 2012 (153 pages).
Liu, J. W. H., "The Multifrontal Method for Sparse Matrix Solution: Theory and Practice", SIAM Review, vol. 34 (1992) pp. 82-109 (29 pages).
Davis, T. A., "User Guide for CHOLMOD: a sparse Cholesky factorization and modification package", Version 1.7, Sep. 20, 2008 (140 pages).

* cited by examiner

ITERATIVELY SIMULATING ELECTROSTATIC DISCHARGES FOR A REDUCED NETLIST

BACKGROUND

Electrostatic Discharges (ESD) may cause various reliability issues in an integrated circuit. For example, an ESD failure may happen when a machine or a person touches the integrated circuit, or a charge builds up inside a chip. Consequently, high current and voltage may physically destroy the chip during the discharge. Specifically, when an ESD protection circuit does not function well and the high voltage ends up on the gate of the chip, the discharge may destroy the thin oxide of a transistor. If the high current passes through a metal interconnect of the transistor, the metal interconnect may also be damaged. Because of process scaling, the thin oxide is getting thinner and the interconnect metal is also getting smaller, which may increase problems associated with electrostatic discharges.

SUMMARY

In general, in one aspect, embodiments relate to a method for modeling electrostatic discharges. The method includes obtaining a circuit netlist for an integrated circuit. The circuit netlist describes connection information for various electronic components within the integrated circuit. The method further includes obtaining, by removing a portion of the electronic components from the circuit netlist, a reduced netlist. The method further includes determining, using the reduced netlist, various circuit parameters regarding an electrostatic discharge event for the integrated circuit. The method further includes simulating, using the circuit parameters, a discharge path within the integrated circuit for the electrostatic discharge event.

In general, in one aspect, embodiments relate to a system for modeling electrostatic discharges. The system includes a processor and a memory executable by the processor. The memory includes functionality for obtaining a circuit netlist for an integrated circuit. The circuit netlist describes connection information for various electronic components within the integrated circuit. The memory further includes functionality for obtaining, by removing a portion of the electronic components from the circuit netlist, a reduced netlist. The memory further includes functionality for determining, using the reduced netlist, various circuit parameters regarding an electrostatic discharge event for the integrated circuit. The memory further includes functionality for simulating, using the circuit parameters, a discharge path within the integrated circuit for the electrostatic discharge event.

In general, in one aspect, embodiments relate to a non-transitory computer readable medium (CRM) storing various instructions for modeling electrostatic discharges. The instructions include functionality for obtaining a circuit netlist for an integrated circuit. The circuit netlist describes connection information for various electronic components within the integrated circuit. The instructions further include functionality for obtaining, by removing a portion of the electronic components from the circuit netlist, a reduced netlist. The instructions further include functionality for determining, using the reduced netlist, various circuit parameters regarding an electrostatic discharge event for the integrated circuit. The instructions further include functionality for simulating, using the circuit parameters, a discharge path within the integrated circuit for the electrostatic discharge event.

Other aspects of the invention will be apparent from the following description and the appended claims.

DETAILED DESCRIPTION

Figure 1A:
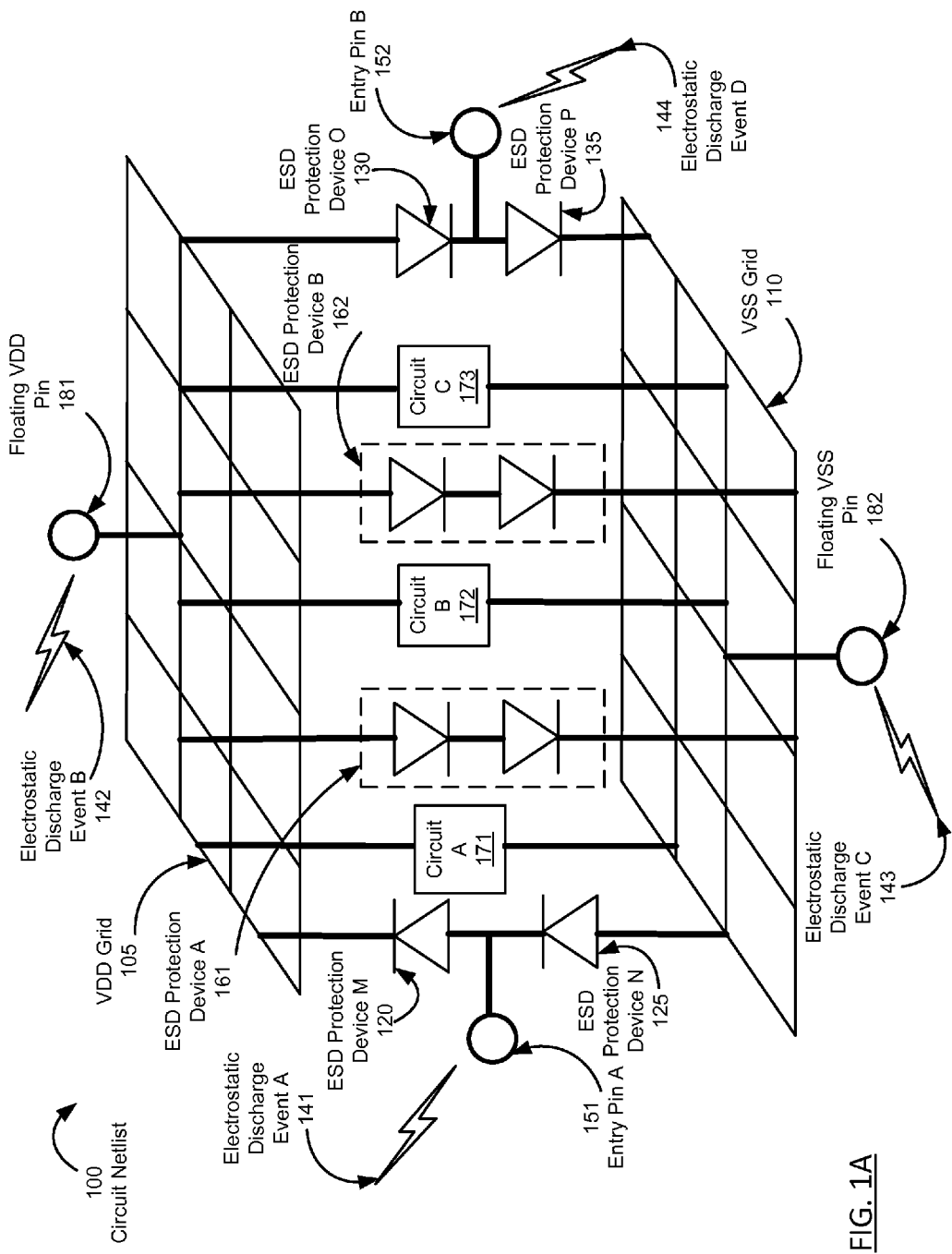
FIGS. 1A-1B show systems in accordance with one or more embodiments.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the invention include a method, a system, and a non-transitory computer readable medium for modeling electrostatic discharges. In particular, one or more embodiments are directed to obtaining a reduced netlist from a circuit netlist for an integrated circuit. Specifically, various active circuits may be removed from the circuit netlist to produce the reduced netlist, while an electrostatic discharge circuit having various ESD protection devices may remain. Furthermore, a current discharge path of an electrostatic discharge event may be simulated using the reduced netlist and corresponding circuit parameters. For example, the reduced netlist may be represented as a diode network and a resistor network having circuit parameters that are iteratively updated to obtain the current discharge path within the integrated circuit.

FIG. 1A shows a circuit netlist (100) for an integrated circuit in accordance with one or more embodiments. Specifically, the circuit netlist (100) may be a software file that describes how various electronic components (e.g., circuit A (171), circuit B (172), circuit C (173), ESD protection device A (161), ESD protection device B (162)) are connected within the integrated circuit. For example, the circuit netlist (100) may describe connection information specifying which ports on an electronic component are connected to other electronic components within the integrated circuit. In particular, connection information may specify how electronic components are connected to a positive power supply and/or a negative power supply. Thus, FIG. 1A illustrates a graphical representation of the circuit netlist (100).

In one or more embodiments, the circuits (171, 172, 173) are active circuits. Specifically, active circuits may include various transistor devices configured for implementing various logical functionality within an integrated circuit. In particular, active circuits may have various "on" and "off" states depending on various input signals transmitted through the integrated circuit. Thus, active circuits may generate unpredictable and/or complex electrostatic discharge scenarios while undergoing simulation.

Keeping with FIG. 1A, the circuit netlist (100) may describe an electrostatic discharge (ESD) circuit with various ESD protection devices (i.e., ESD protection device A (161), ESD protection device B (162)). An ESD protection device may be a circuit that shields nearby electronic components from electrostatic discharge events, e.g., voltage spikes. For example, an ESD protection device may be a voltage clamp that dissipates power resulting from a power surge in a particular direction. Thus, in one or more embodiments, an ESD protection device may be represented as a series of diodes as shown in FIG. 1A, i.e., for ESD protection devices (161, 162).

Furthermore, the circuit netlist (100) may define power supply voltages and grounds for the electronic components. In particular, the circuit netlist (100) may include a VDD grid (105) representing the positive supply voltage for electronic components within the integrated circuit and a VSS grid (110) representing the negative supply voltage or the circuit ground for electronic components within the integrated circuit. Thus, a floating VDD pin (181) representing power in the circuit may be coupled to the VDD grid (105), while a floating VSS pin (182) representing ground may be coupled to the VSS grid (110). For example, the VDD pin (181) and the VSS pin (182) may be connected to a power and ground, respectively, during normal circuit operations. As such, ESD events may come from these two pins.

In one or more embodiments, various ESD events (e.g., electrostatic discharge event A (141), ESD event B (142), ESD event C (143), and ESD event D (144)) are simulated using the circuit netlist (100). In particular, an ESD event may be an electrical pulse that impacts a portion of the integrated circuit. For example, the ESD event may generate a current, e.g., 1 Amp, over a short duration of time, e.g., 1 nanosecond to 100 nanoseconds. As such, the discharge path of the current may be modeled from the circuit netlist (100) over a particular period of time, and thereby simulating how the ESD event may affect active circuits and ESD protection devices (161, 162).

To simulate an ESD event, a discharge path may be modeled from an entry pin (e.g., entry pin (151), entry pin (152)) through various ESD protection devices. Specifically, one or more ESD protection devices may be represented as ESD protection device M (120), ESD protection device N (125), ESD protection device O (130), and ESD protection device P (135), where the ESD protection devices (120, 125, 130, 135) are located in a different region of the integrated circuit as the other ESD protection devices (161, 162). Thus, the ESD protection devices (120, 125, 130, 135) may connect to the pins (151, 152) and may be in the I/O circuit. Therefore, the ESD protection devices (120, 125, 130, 135) may be the primary ESD protection devices when ESD current comes from an entry pin. Furthermore, ESD protection devices (161, 162) may be close to the core circuit to protect core devices nearby. In one or more embodiments, the discharge path is modeled through the ESD protection devices (120, 125, 130, 135) and/or the ESD protection devices (161, 162).

Figure 1B:
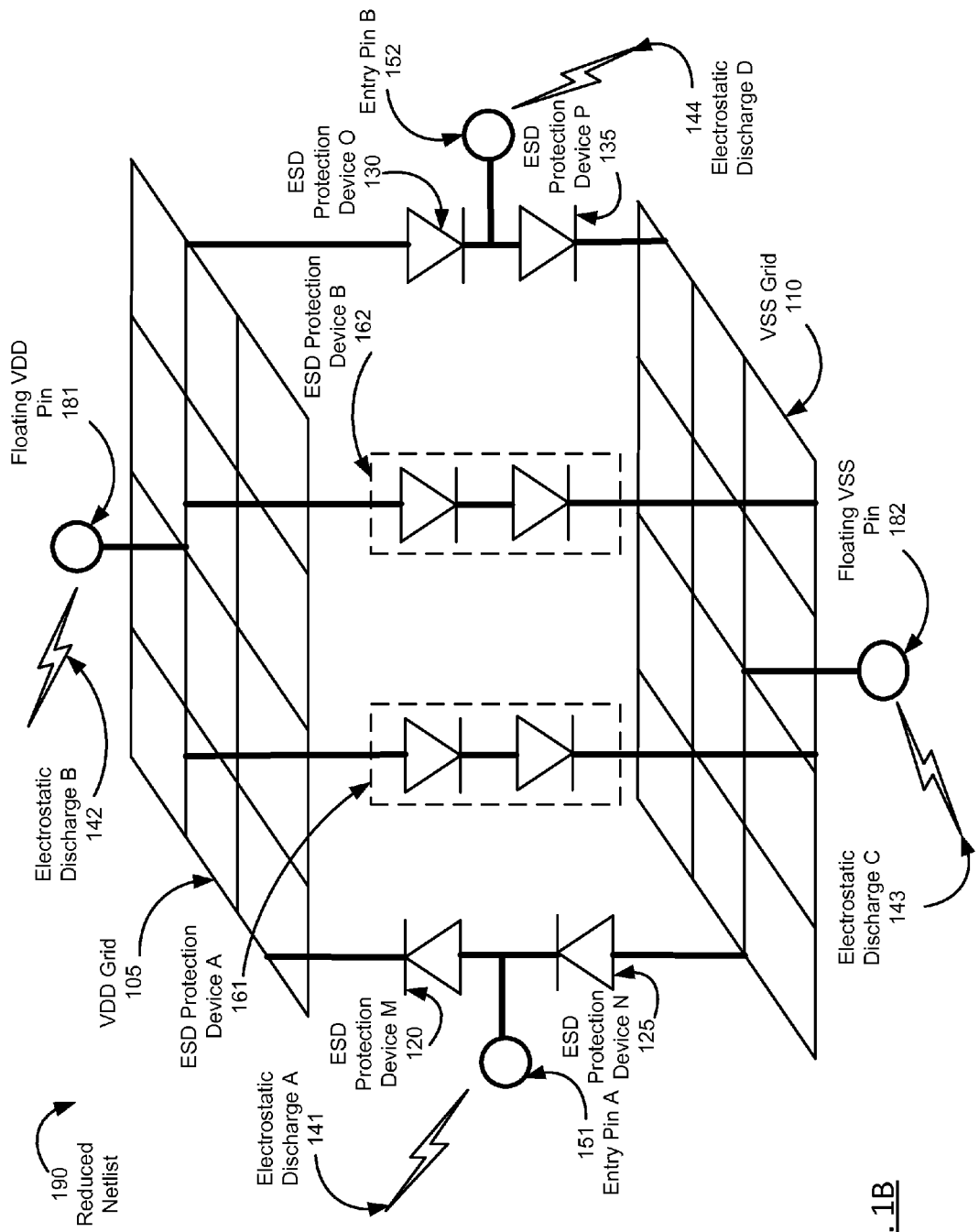

FIG. 1B shows a reduced netlist (190) for an integrated circuit in accordance with one or more embodiments. As shown in FIG. 1B, in one or more embodiments, various electronic components are removed from the circuit netlist (100) to produce the reduced netlist (190). In particular, the circuits (171, 172, 173) are removed from the circuit netlist (100), while the ESD protection devices (161, 162) remain in the reduced circuit netlist (190). Therefore, the reduced netlist (190) may provide discharge paths with less complexity and fewer electronic components for simulating the ESD events (141, 142, 143, 144).

Figure 2:
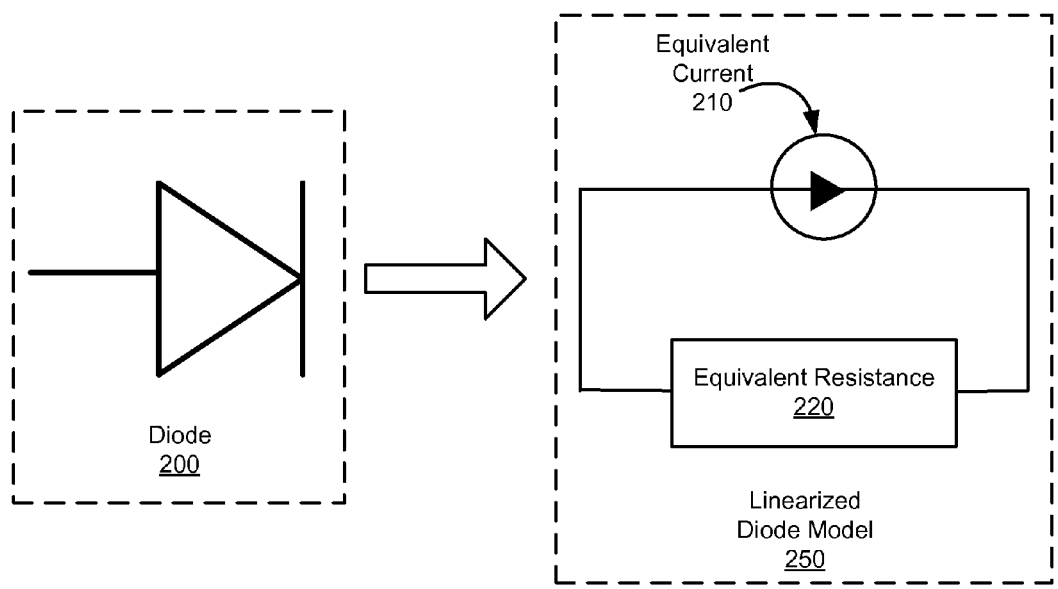
FIG. 2 shows a schematic in accordance with one or more embodiments.

FIG. 2 shows a schematic in accordance with one or more embodiments. Turning to FIG. 2, a diode (200) is shown represented by a linearized diode model (250). Specifically, the linearized diode model (250) may represent the diode (200) as an equivalent current source (210) with an equivalent resistor (220) in parallel with the equivalent current source (210). The equivalent current source (210) may represent an amount of current passing through the diode (200) at a particular point of time. On the other hand, the equivalent resistance (220) may represent an equivalent amount of impedance of the diode (200).

In one or more embodiments, the diode (200) represents an ESD diode as included in an ESD simulation. An ESD diode may form a portion of an ESD circuit, such as a portion of an ESD protection device. In particular, the operating point of the ESD diode may be in the high current range where the diode (200) works as a linear device, e.g., having good linearity from 0.01 A to 1 A in various simulations.

Using the linearized diode model (250), the diodes in an integrated circuit (e.g., the ESD protection devices (161, 162) and the diodes (120, 125, 130, 135) in FIG. 1) may be represented by their piecewise linearized model. Thus, the linear system may correspond to a diode and resistor matrix for computing various simulation values. In one or more embodiments, the linear system may be expressed using the following equation:

$$Gv = I \qquad \text{Equation 1}$$

where G is the admittance matrix from a resistor network (i.e., admittance may be a measurement of how easily current flows through a circuit and thus the inverse of impedance), v is a vector of nodal voltage, and I is the vector of current sources in the linear network. When a diode is added to a circuit netlist or reduced netlist, an equivalent resistance of the diode may be added to the admittance matrix G, while an equivalent current source of the diode may be added to the vector of current sources I. In one or more embodiments, where the linear system includes only resistors and current sources, the G admittance matrix has a symmetric positive definite (spd) property.

In the DC analysis of the linear system, the operating point of each diode (i.e., for each diode, an actual value of the equivalent resistor and an actual value of the equivalent current source) may be found using an iterative algorithm, such as Newton-Raphson iteration. In the iterative algorithm, values in the admittance matrix G and the vector of current sources I may be updated with each iteration. As such, admittance matrix G may be factorized and solved for each iteration.

Furthermore, in one or more embodiments, the simulated circuit only includes resistors and diodes. Thus, Equation 1 may be rewritten to separate the linear and nonlinear parts of the simulated circuit, as shown using the following equation:

$$\begin{bmatrix} Grr & Grd \\ Grd^T & Gdd \end{bmatrix} \begin{bmatrix} Vr \\ Vd \end{bmatrix} = \begin{bmatrix} Ir \\ Id \end{bmatrix} \quad \text{Equation 2}$$

where Vr is the nodal voltage of the resistor nodes, and Vd is the nodal voltage of the diode nodes. The admittance matrix G from Equation 1 may be regrouped according to Vr and Vd. Thus, diode equivalent resistances may be located in the Gdd block, while Grr and Grd may not change in each iteration. In one or more embodiments, Grr represents the matrix of various resistors whose two nodes only connect to the resistor. In one or more embodiments, Grd represents the off-diagonal matrix of various resistors who have one node that connects to the diode and the other node connects to the resistor. In one or more embodiments, Gdd represents the matrix of linearized resistors of diodes and some resistors who have at least one node connects to the diode. For example, in a simulated circuit, there may be $1$-$10^3$ diodes and $10^6$-$10^9$ resistors. Thus, Gdd may include $1$-$10^3$ nodes and Grr may include $10^6$-$10^9$ nodes. Because Grr may be much larger than Gdd while Grr may not change in an iteration, a Schur complement method from linear algebra may be applied to solve Gdd and Grr separately as shown in Equations (3) and (4):

$$\overline{G}_{dd}V_d = I_d - G_{rd}^T G_{rr}^{-1} I_r, \text{ where}$$
$$\overline{G}_{dd} = G_{dd} - G_{rd}^T G_{rr}^{-1} G_{rd} \quad \text{Equation 3}$$

$$G_{rr}V_d = I_r - G_{rd}V_d \quad \text{Equation 4}$$

where $\overline{G}dd$ may be at least 3 orders smaller than Grr, $\overline{G}dd$ may be computed explicitly. As such, an actual calculation of the inverse of Grr may be ignored. Furthermore, $Grr^{-1}Grd$ may be obtained by solving Grr with respect to each column of Grd. Thus, each column may be independent of each other column. For example, the solution to Equations 3 and 4 may be calculated using parallel solving. $\overline{G}dd$ may be solely formed by the resistor network constructed by the power grid resistor and the linearized resistor of diode, while also being an spd matrix similar to Grr. Both $\overline{G}dd$ and Grr may then be solved by various linear solvers. For example, because both $\overline{G}dd$ and Grr are spd matrices, a Cholesky factorization may be used instead of lower-upper (LU) factorization found in various circuit simulators. As such, the Cholesky factorization may provide for better runtime and memory efficiency in performing ESD simulations. Although $\overline{G}dd$ may be updated in each iteration, ordering and symbolic factorization may be used for $\overline{G}dd$ only once. In one or more embodiments, factorization is used to determine two attributes of the reduced matrix formed in the factorization. First, factorization may be used to determine where in the matrix should have the non-zero value, which may be performed by ordering/symbolic factorization. Second, numerical factorization may be used to determine what is the numerical value of the non-zero entry in the matrix. Thus, in one or more embodiments, only numerical factorization is used in each iteration to update the values of the admittance matrix G.

Figure 3:
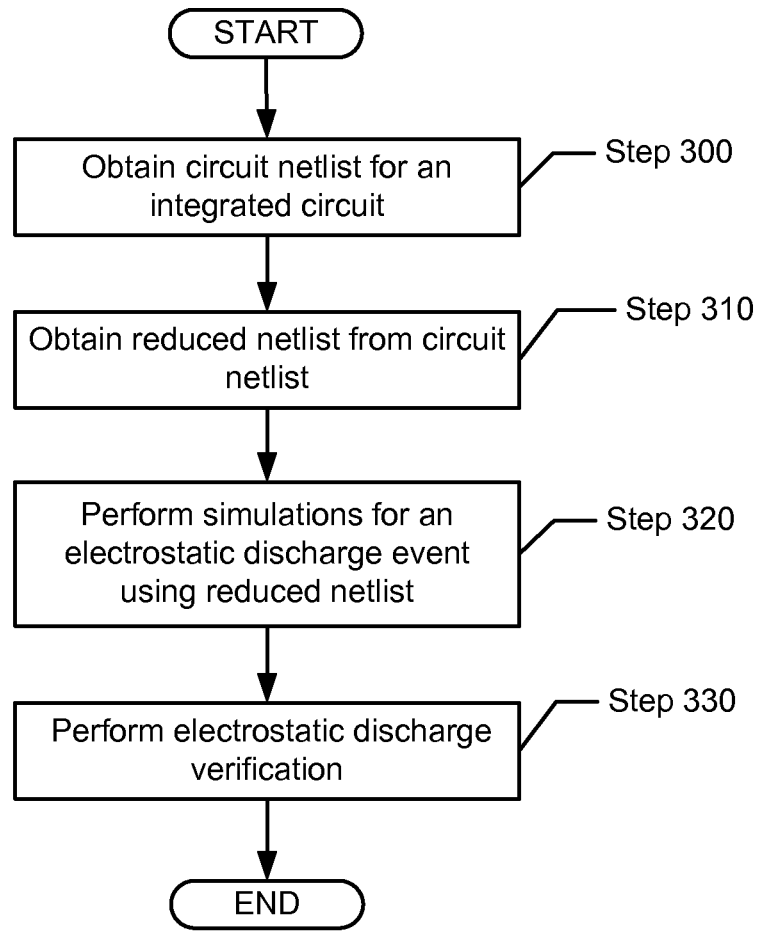
FIGS. 3-4 show flowcharts in accordance with one or more embodiments.

FIG. 3 shows a flowchart for modeling an ESD in accordance with one or more embodiments. Specifically, one or more steps in FIG. 3 may be performed by a computing device as described in FIG. 5. While the various steps in these flowcharts are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 300, a circuit netlist is obtained for an integrated circuit in accordance with one or more embodiments. For example, the circuit netlist may be obtained from a register-transfer level (RTL) file describing the integrated circuit. As such, the circuit netlist may be obtained as a user input to a circuit simulation application for performing the process described in FIG. 3.

In Step 310, a reduced netlist is obtained from the circuit netlist in accordance with one or more embodiments. In one or more embodiments, for example, various electronic components are removed from the circuit netlist to produce the reduced netlist. Thus, a circuit simulation application may parse the circuit netlist in Step 300 and automatically identified electronic components for exclusion. On the other hand, a user may identify electronic components for exclusion from the reduced netlist. In one or more embodiments, the identified electronic components may be active circuits, components having transistors, and/or any designated type of electronic component selected for exclusion from the reduced netlist. In one or more embodiments, electronic components are selected from the circuit netlist with DC voltage characteristics that match a linearized diode model, such as ESD protection devices.

In Step 320, various simulations are performed for an ESD event using the reduced netlist in accordance with one or more embodiments. In one or more embodiments, for example, a discharge path through an integrated circuit is simulated using the reduced netlist. Using FIG. 1B, for example, a discharge path may be modeled for the ESD events (141, 142, 143, 144) from an entry point to other regions of the integrated circuit.

In Step 330, ESD verification is performed in accordance with one or more embodiments. For example, ESD verification may include an analysis of various discharge paths for ESD events for an entire integrated circuit given the unknown location where an ESD event may occur. Thus, an independent verification may be performed for each ESD possibility.

In one or more embodiments, ESD verification includes performing a global simulation of an integrated circuit through a series of ESD simulations across the integrated circuit. In particular, ESD verification may include determining a range of ESD scenarios for a particular electronic component. Specifically, if a worst case scenario is determined for a protected electronic component near a particular ESD protection device, electronic components surrounding the ESD protection device may be analyzed using the characteristics of the worst case scenario. In one or more embodiments, various electronic components that were removed before the ESD simulation are simulated to obtain various voltage and current results inside the electronic components when ESD event occurs.

Furthermore, ESD verification may include performing a comparison between electrical characteristics obtained through an ESD simulation and various design specifications (e.g., specifications imposed by a hardware manufacturer). A software application may generate a report describing the electrical characteristics of the ESD verification, such as whether the integrated circuit passes or fails any verification criteria (e.g., will a particular ESD event damage a portion of the integrated circuit).

Figure 4:
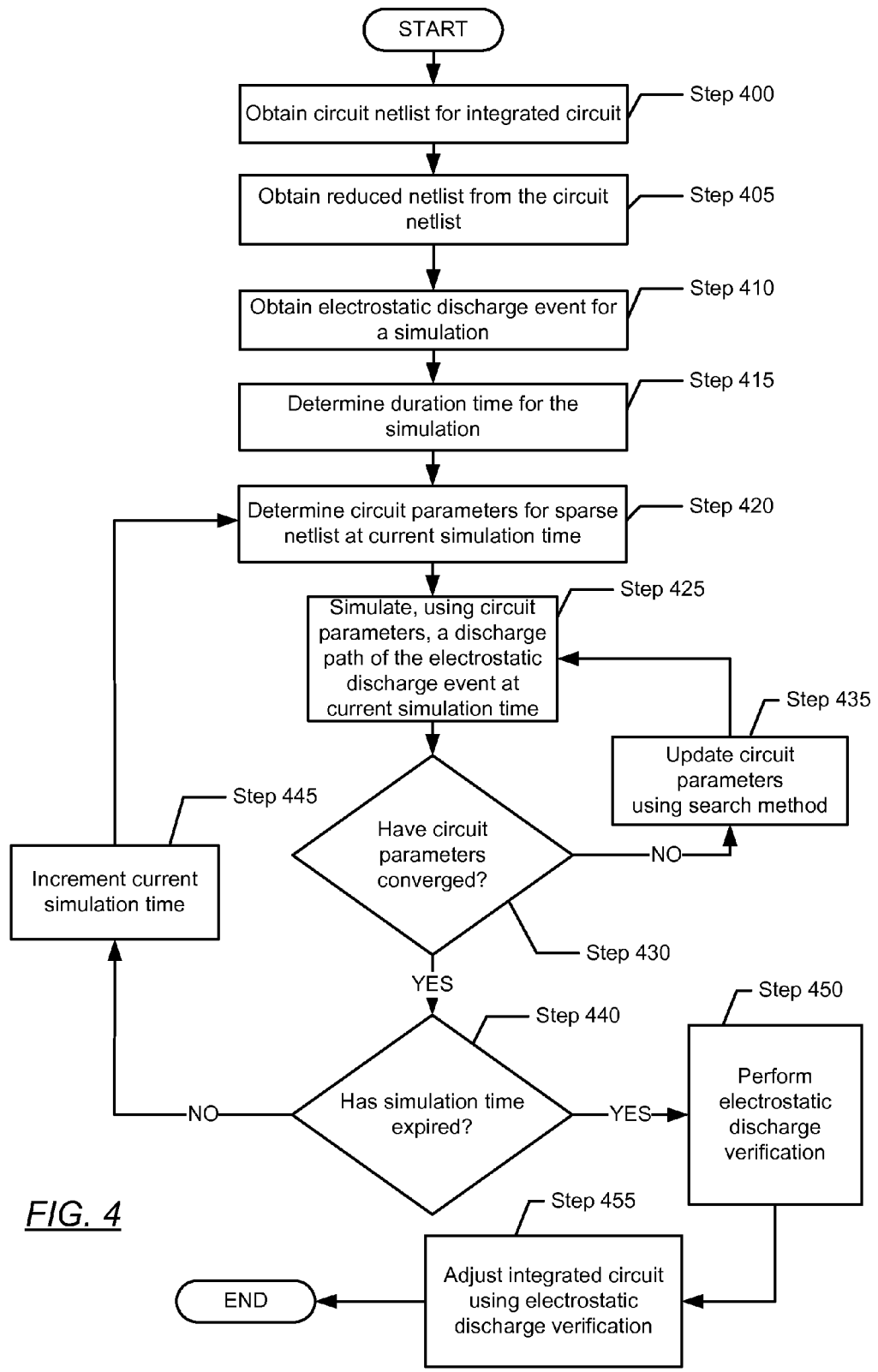

FIG. 4 shows a flowchart for modeling an ESD in accordance with one or more embodiments. Specifically, one or more steps in FIG. 4 may be performed by a computing device as described in FIG. 5. While the various steps in these flowcharts are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 400, a circuit netlist is obtained for an integrated circuit in accordance with one or more embodiments.

In Step 405, a reduced netlist is obtained from a circuit netlist in accordance with one or more embodiments. In one or more embodiments, various electronic components are pruned from the circuit netlist in Step 400. For example, active circuits may be removed, thus reducing the size of the circuit netlist from step 400. On the other hand, other electronic components, such as ESD protection devices for an ESD circuit, may be selected for inclusion into the reduced netlist.

Furthermore, the reduced netlist may be represented as a chain of diodes and interconnects as shown in FIG. 1B. In one or more embodiments, one or more core circuits are added into the reduced netlist for simulating the interaction with the remaining electronic components. For example, a core circuit may be a functional block within an integrated circuit, such as an adder or a multiplexer.

In one or more embodiments, portions of the circuit netlist are removed according to a port where the simulated ESD events occurs. For example, any portion of the circuit netlist remote from the port with the simulated ESD event may be removed.

In Step 410, an ESD event is obtained for a simulation in accordance with one or more embodiments. In particular, the ESD event may include one or more pulses having various discharge characteristics, such as a specific voltage amplitude, pulse duration, a starting location within the integrated circuit (e.g., a particular entry pin), etc. In one or more embodiments, the simulation may include multiple ESD events having independent discharge characteristics. Thus, a global ESD simulation of an integrated circuit may be performed using a wide range of ESD events.

In Step 415, a duration time is determined for a simulation in accordance with one or more embodiments. The duration time may include a specific period of time (e.g., 0 to 100 nanoseconds) for performing the simulation. The duration time may be a default period of time that includes an initial simulation time and an ending simulation time for simulating an ESD event. In one or more embodiments, the duration time is calculated automatically by a simulation software application based on the discharge characteristics of the corresponding ESD event or based on the size of the reduced netlist. The duration time may also be designated by a user input.

In Step 420, various circuit parameters are determined for the reduced netlist at a current simulation time in accordance with one or more embodiments. In particular, the circuit parameters correspond to a simulated circuit based on the reduced netlist. For example, the circuit parameters may include admittance values for resistors and diodes from the reduced netlist obtain in Step 405. Circuit parameters may also include various current values within a simulated circuit resulting from an ESD event. Thus, the circuit parameters may correspond to various parameters as described with respect to Equations 1-4 described above. With respect to the simulation time, a simulation involving Steps 420-445 may have the current simulation time set to zero during the first iteration. For other iterations, the current simulation time may be obtained from Step 445 described below.

In one or more embodiments, the circuit parameters include a resistor network (i.e., a linear resistance matrix) and a separate diode network (i.e., a PWL diode matrix). Thus, computations may be performed directly on the resistor network or the diode network during simulations of an ESD event, which may increase the computation speed of a simulation at a particular simulation time.

In Step 425, a discharge path of the ESD event is simulated using various circuit parameters at the current simulation time in accordance with one or more embodiments. In one or more embodiments, for example, diode voltages values are calculated for a simulated circuit using the circuit parameters from Step 420 or Step 435. Specifically, the diode voltages Vd may be calculated using Equations 3 and 4. As such, the diode voltages values may correspond to various current characteristics and admittance characteristics of the discharge path of the ESD event as defined by the circuit parameters.

In Step 430, a determination is made whether the circuit parameters have converged in accordance with one or more embodiments. In particular, the circuit parameters used in Step 425 may be analyzed for whether the circuit parameters accurately model the ESD event at the current simulation time. In one or more embodiments, for example, diode voltages calculated in Step 425 are analyzed using a convergence criterion. Specifically, the diode voltages calculated may be compared with a set of diode voltages obtained in a previous iteration of Steps 425-435. Thus, a difference may be computed between the two sets of diode voltages, while the convergence criterion may correspond to whether the difference has reached a particular limit (e.g., has the different stopped changing between iterations). When it is determined that the simulation has converged, the process proceeds to Step 440. When it is determined that the simulation has not converged, the process proceeds to Step 435.

In Step 435, circuit parameters are updated using a search method in accordance with one or more embodiments. In particular, various iterative search methods may be used such as Newton-Raphson iteration described above, but other search methods may be used as well. Thus, various circuit parameters, such as current values for diodes located in the reduced netlist, may be increased or decreased accordingly in Step 435. The updated circuit parameters may be used in another simulation in Step 425.

In one or more embodiments, only circuit parameters for a diode network are updated in Step 435. Thus, resistance values or admittance values for a resistor network may remain static throughout Steps 425-435.

In Step 440, a determination is made whether the simulation time has expired in accordance with one or more embodiments. In particular, the current simulation time in Step 420 may be compared with the duration time for the simulation from Step 415. Thus, if the current simulation time is past the designated duration time for the simulation, then the overall simulation may end. As such, when it is determined that the simulation time has expired, the process proceeds to Step 450. When it is determined that more time exists for the simulation, the process proceeds to Step 445.

In Step 445, the current simulation time is incremented in accordance with one or more embodiments. In particular, a time step may be defined for the simulation, e.g., 5 nanoseconds. As such, a value of the time step may be added to the current simulation time, thus updating the simulation time. Thus, the updated simulation time may be passed to Step 420 where it may be used for the next iterations of Steps 420-440.

In Step 450, an ESD verification is performed in accordance with one or more embodiments. Using the final circuit parameters (i.e., circuit parameters obtained after convergence), an ESD verification may be performed spanning the entire time duration of an ESD event.

In Step 455, the integrated circuit is adjusted using an ESD verification in accordance with one or more embodiments. In particular, the integrated circuit may be optimized using the verification performed in Step 450 to reduce redundant ESD protection devices or identify locations within an integrated circuit having insufficient ESD protection devices (e.g., where the ESD may generate current damaging a nearby electronic component). As such, the adjustment performed in Step 455 may include adding and/or removing various ESD protection devices within the design of the integrated circuit. In one or more embodiments, the design of ESD circuit is determined using a critical resistance path of an ESD event generated over various simulations.

In one or more embodiments, for example, a major bottleneck for ESD simulation is the high computational cost. As shown above, in one or more embodiments, the method, the system, and/or the non-transitory computer readable medium reduce the runtime of an ESD simulation for practical usage, where the circuit is first pruned. Furthermore, various complicated core circuits may be removed from the ESD simulation which, in one or more embodiments, only has a resistor and diode network. Thus, in one or more embodiments, the voltage and current distribution of the resistor and diode network is quickly calculated for an ESD event. In one or more embodiments, a worst case scenario of the core circuit is estimated.

In one or more embodiments, a separate simulation of the core circuit is executed by using the voltage and current inputs calculated from an ESD simulation, if voltage and current values on the core circuit are desired. In one or more embodiments, for example, diodes in the ESD simulation are pre-characterized as a linearized model and inserted into the ESD simulation. Thus, in one or more embodiments, the linearized model is simpler than the original model with little sacrifice regarding accuracy. In one or more embodiments, the linearized diode model is constructed by an equivalent current source and an equivalent resistor. Specifically, in one or more embodiments, the linearized diode model retains the symmetric positive definite (spd) property of the matrix when it is connected with the resistor network. Using the spd property, in one or more embodiments, a fast matrix solution is obtained. In one or more embodiments, to increase the speed of the ESD simulation, a matrix is separated from Equation 1 into Equations 3 and 4. Thus, in one or more embodiments, instead of factorizing a large admittance matrix G in each iteration, a smaller matrix $\overline{G}dd$ is factorized in each iteration.

Furthermore, the method, system, and/or non-transitory computer readable medium may implement several levels of parallelization. In one or more embodiments, different ESD events are applied to different pins in the simulated circuit netlist, and thus simulated simultaneously. In one or more embodiments, matrix factorization and multiplication are also parallelized. As such, in one or more embodiments, by using various technologies, a highly computationally inexpensive task on ESD simulation is accomplished for practical application.

Figure 5:
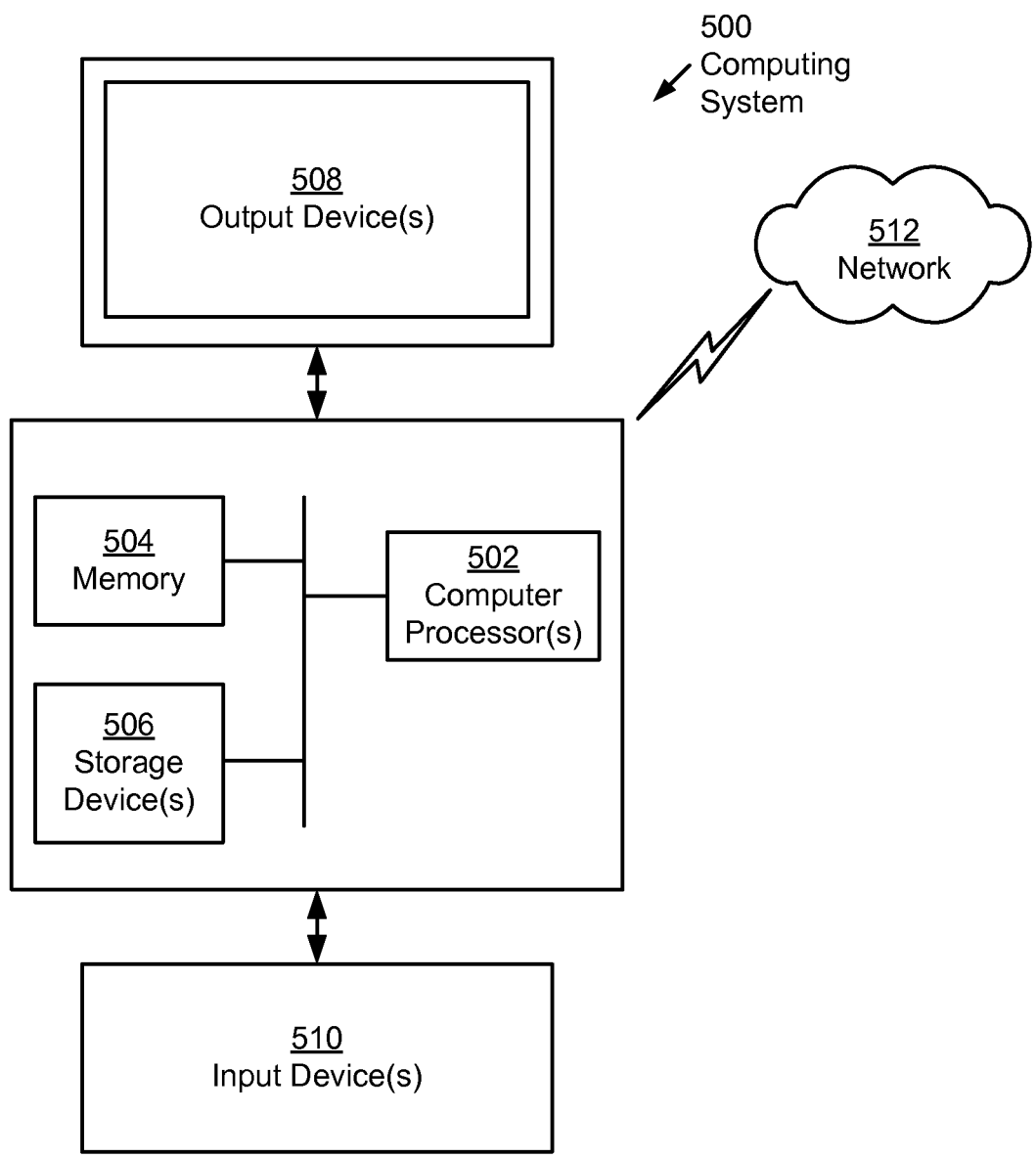
FIG. 5 shows a computing system in accordance with one or more embodiments.

Embodiments of the invention may be implemented on a computing system. Any combination of mobile, desktop, server, embedded, or other types of hardware may be used. For example, as shown in FIG. 5, the computing system (500) may include one or more computer processor(s) (502), associated memory (504) (e.g., random access memory (RAM), cache memory, flash memory, etc.), one or more storage device(s) (506) (e.g., a hard disk, an optical drive such as a compact disk (CD) drive or digital versatile disk (DVD) drive, a flash memory stick, etc.), and numerous other elements and functionalities. The computer processor (s) (502) may be an integrated circuit for processing instructions. For example, the computer processor(s) may be one or more cores, or micro-cores of a processor. The computing system (500) may also include one or more input device(s) (510), such as a touchscreen, keyboard, mouse, microphone, touchpad, electronic pen, or any other type of input device. Further, the computing system (500) may include one or more output device(s) (508), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system (500) may be connected to a network (512) (e.g., a local area network (LAN), a wide area network (WAN) such as the Internet, mobile network, or any other type of network) via a network interface connection (not shown). The input and output device(s) may be locally or remotely (e.g., via the network (512)) connected to the computer processor(s) (502), memory (504), and storage device(s) (506). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the invention.

Further, one or more elements of the aforementioned computing system (500) may be located at a remote location and connected to the other elements over a network (512). Further, embodiments of the invention may be implemented on a distributed system having a plurality of nodes, where each portion of the invention may be located on a different node within the distributed system. In one embodiment of the invention, the node corresponds to a distinct computing device. Alternatively, the node may correspond to a computer processor with associated physical memory. The node may alternatively correspond to a computer processor or micro-core of a computer processor with shared memory and/or resources.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for modeling electrostatic discharges, comprising:

obtaining, from a software file, a circuit netlist for a simulated integrated circuit, wherein the circuit netlist describes connection information for a plurality of electronic components within the simulated integrated circuit;

obtaining, by removing a portion of the plurality of electronic components from the circuit netlist, a reduced netlist with a computer simulation runtime that is less than a computer simulation runtime of the circuit netlist for the simulated integrated circuit;

determining, using the reduced netlist, a plurality of circuit parameters regarding an electrostatic discharge event for the simulated integrated circuit;

simulating, using a computer processor and the plurality of circuit parameters, a discharge path within the simulated integrated circuit for the electrostatic discharge event, wherein simulating the discharge path comprises:

updating, using an iterative search method, the plurality of circuit parameters to produce a plurality of updated circuit parameters that describe the discharge path, wherein the plurality of circuit parameters are updated iteratively during a plurality of computer simulations of the electrostatic discharge event until the plurality of updated circuit parameters converge to a convergence criterion; and generating, using the computer processor and the discharge path within the simulated integrated circuit, a plurality of design specifications for a hardware manufacturer to manufacture a physical integrated circuit.

2. The method of claim 1, further comprising:
performing, using the discharge path, an electrostatic discharge verification analysis on the simulated integrated circuit.

3. The method of claim 1,
wherein the plurality of circuit parameters comprises a diode network and a resistor network, and
wherein updating the plurality of circuit parameters comprises updating the diode network.

4. The method of claim 1,
wherein simulating the discharge path further comprises determining a plurality of diode voltage values for a simulated circuit corresponding to the reduced netlist.

5. The method of claim 1, further comprising:
determining an initial simulation time for the electrostatic discharge event; and
determining an ending simulation time for the electrostatic discharge event,
wherein the discharge path describes the electrostatic discharge event from the initial simulation time to the ending simulation time.

6. The method of claim 1,
wherein the reduced netlist comprises a plurality of electrostatic discharge protection devices, and
wherein the plurality of circuit parameters comprise a plurality of admittance values and a plurality of current values for the plurality of electrostatic discharge protection devices.

7. The method of claim 1,
wherein the portion of the plurality of electronics components removed from the circuit netlist comprise a plurality of transistor devices within the simulated integrated circuit.

8. A system for modeling electrostatic discharges, comprising:
a processor;
a memory executable by the processor, the memory comprising functionality for:

obtaining, from a software file, a circuit netlist for a simulated integrated circuit, wherein the circuit netlist describes connection information for a plurality of electronic components within the simulated integrated circuit;

obtaining, by removing a portion of the plurality of electronic components from the circuit netlist, a reduced netlist with a computer simulation runtime that is less than a computer simulation runtime of the circuit netlist for the simulated integrated circuit;

determining, using the reduced netlist, a plurality of circuit parameters regarding an electrostatic discharge event for the simulated integrated circuit;

simulating, using the plurality of circuit parameters, a discharge path within the simulated integrated circuit for the electrostatic discharge event, wherein simulating the discharge path comprises:

updating, using an iterative search method, the plurality of circuit parameters to produce a plurality of updated circuit parameters that describe the discharge path, wherein the plurality of circuit parameters are updated iteratively during a plurality of computer simulations of the electrostatic discharge event until the plurality of updated circuit parameters converge to a convergence criterion; and generating, using the discharge path within the simulated integrated circuit, a plurality of design specifications for a hardware manufacturer to manufacture a physical integrated circuit.

9. The system of claim 8, wherein the memory further comprises functionality for:
performing, using the discharge path, an electrostatic discharge verification analysis on the simulated integrated circuit.

10. The system of claim 8, wherein the memory further comprises functionality for:
determining an initial simulation time for the electrostatic discharge event; and
determining an ending simulation time for the electrostatic discharge event,
wherein the discharge path describes the electrostatic discharge event from the initial simulation time to the ending simulation time.

11. The system of claim 8,
wherein the reduced netlist comprises a plurality of electrostatic discharge protection devices, and
wherein the plurality of circuit parameters comprise a plurality of admittance values and a plurality of current values for the plurality of electrostatic discharge protection devices.

12. The system of claim 8,
wherein the portion of the plurality of electronics components removed from the circuit netlist comprise a plurality of transistor devices within the simulated integrated circuit.

13. A non-transitory computer readable medium storing instructions for modeling electrostatic discharges, the instructions comprising functionality for:
obtaining, from a software file, a circuit netlist for a simulated integrated circuit, wherein the circuit netlist describes connection information for a plurality of electronic components within the simulated integrated circuit;

obtaining, by removing a portion of the plurality of electronic components from the circuit netlist, a reduced netlist with a computer simulation runtime that is less than a computer simulation runtime of the circuit netlist for the simulated integrated circuit;

determining, using the reduced netlist, a plurality of circuit parameters regarding an electrostatic discharge event for the simulated integrated circuit;

simulating, using the plurality of circuit parameters, a discharge path within the simulated integrated circuit for the electrostatic discharge event, wherein simulating the discharge path comprises:

updating, using an iterative search method, the plurality of circuit parameters to produce a plurality of updated circuit parameters that describe the discharge path, wherein the plurality of circuit parameters are updated iteratively during a plurality of computer simulations of the electrostatic discharge event until the plurality of updated circuit parameters converge to a convergence criterion;

generating, using the discharge path of the simulated integrated circuit, a plurality of design specifications for a hardware manufacturer to manufacture a physical integrated circuit.

14. The non-transitory computer readable medium of claim 13, wherein the instructions further comprise functionality for:

performing, using the discharge path, an electrostatic discharge verification analysis on the integrated circuit.

15. The non-transitory computer readable medium of claim 13, wherein simulating the discharge path further comprises determining a plurality of diode voltage values for a simulated circuit corresponding to the reduced netlist.

16. The non-transitory computer readable medium of claim 13, wherein the reduced netlist comprises a plurality of electrostatic discharge protection devices, and wherein the plurality of circuit parameters comprise a plurality of admittance values and a plurality of current values for the plurality of electrostatic discharge protection devices.

17. The non-transitory computer readable medium of claim 13, wherein the portion of the plurality of electronics components removed from the circuit netlist comprise a plurality of transistor devices within the simulated integrated circuit.

* * * * *